United States Patent
Banna

(10) Patent No.: US 10,147,652 B2
(45) Date of Patent: Dec. 4, 2018

(54) METHOD, APPARATUS AND SYSTEM FOR ADVANCED CHANNEL CMOS INTEGRATION

(71) Applicant: GLOBALFOUNDRIES Inc., Grand Cayman (KY)

(72) Inventor: Srinivasa Banna, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/630,529

(22) Filed: Feb. 24, 2015

(65) Prior Publication Data

US 2016/0247724 A1    Aug. 25, 2016

(51) Int. Cl.

| | |
|---|---|
| H01L 29/38 | (2006.01) |
| H01L 21/8258 | (2006.01) |
| H01L 21/8252 | (2006.01) |
| H01L 29/20 | (2006.01) |
| H01L 29/161 | (2006.01) |
| H01L 27/092 | (2006.01) |
| H01L 29/66 | (2006.01) |
| H01L 29/78 | (2006.01) |
| H01L 29/786 | (2006.01) |
| H01L 29/10 | (2006.01) |
| H01L 21/8238 | (2006.01) |

(52) U.S. Cl.
CPC ...... *H01L 21/8258* (2013.01); *H01L 21/8252* (2013.01); *H01L 27/092* (2013.01); *H01L 29/1054* (2013.01); *H01L 29/161* (2013.01); *H01L 29/20* (2013.01); *H01L 29/66522* (2013.01); *H01L 29/66568* (2013.01); *H01L 29/7849* (2013.01); *H01L 29/78603* (2013.01); *H01L 29/78681* (2013.01); *H01L 21/823807* (2013.01)

(58) Field of Classification Search
CPC .............. H01L 27/092; H01L 27/0922; H01L 27/0924; H01L 21/02381; H01L 21/02392; H01L 21/02395; H01L 21/02398
See application file for complete search history.

(56) References Cited

U.S. PATENT DOCUMENTS

| | | | | |
|---|---|---|---|---|
| 2007/0059875 A1* | 3/2007 | Mishima | ............... | H01L 21/268 438/199 |
| 2010/0327395 A1* | 12/2010 | Hamaguchi | ........... | H01L 21/187 257/501 |

(Continued)

OTHER PUBLICATIONS

Search Report for Taiwan Patent Application No. 105103106; dated Mar. 27, 2017.

*Primary Examiner* — Steven H Loke
*Assistant Examiner* — Scott Stowe
(74) *Attorney, Agent, or Firm* — Williams Morgan, P.C.

(57) ABSTRACT

At least one method, apparatus and system disclosed involves a semiconductor substrate on which NMOS and PMOS devices with enhanced current drives may be formed. A first substrate having an enhanced electron mobility is formed. A second substrate having an enhanced hole mobility is formed. The first substrate and the second substrate are bonded for forming a third substrate. A first channel on the third substrate characterized by the enhanced electron mobility is formed. A second channel on the third substrate characterized by the enhanced hole mobility is formed.

13 Claims, 10 Drawing Sheets

(56) References Cited

U.S. PATENT DOCUMENTS

2014/0077303 A1\* 3/2014 Baek .................. G06F 17/5063
257/365
2014/0091398 A1\* 4/2014 Hata .................. H01L 21/8258
257/369

\* cited by examiner

First Substrate (600)

630 — Al₂O₃
620 — InGaAs
610 — InP

Fig. 6

Second Substrate (700)

730 — SiO₂
720 — SiGe
710 — Si

Fig. 7

METHOD, APPARATUS AND SYSTEM FOR ADVANCED CHANNEL CMOS INTEGRATION

FIELD OF THE INVENTION

Generally, the present disclosure relates to the manufacture of sophisticated semiconductor devices, and, more specifically, to fabricating high mobility PMOS and NMOS devices using advanced channel CMOS integration.

DESCRIPTION OF THE RELATED ART

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a plurality of process technologies are currently practiced, wherein, for many types of complex circuitry, including field effect transistors, MOS technology is currently among the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. During fabrication of N-channel MOS (NMOS) devices and/or P-channel MOS (PMOS) devices, designers often control process steps to allow for increase current drive of those devices. For NMOS devices, the flow of electrons may be enhanced for increased current drive. For PMOS devices, the flow of "holes" may be enhanced for increased current drive. For example, a strained silicon layer is often formed to provide for improved transport of charge particles (i.e., electrons or holes).

There is a growing consensus in the industry that traditional channel materials, such as SiGe/Ge may not be suitable for nFET devices. Designers have implemented modified nFET channel materials such as strained Si or Ge materials, or so-called III-V materials GaAs or InGaAs. FIG. 1 illustrates a stylized cross-sectional view of a prior art base structure for forming an NMOS device. A silicon substrate layer 110 is formed, upon which a strained relaxed buffer (SRB) layer 120 may be formed. A strained silicon layer (i.e., strained channel material layer) 130 is then formed on the SRB layer 120. For an NMOS device, the strain is directed to a tensile strain. The buffer layer 120 is required to be strain relaxed in order to allow the formation of a strained silicon layer 130. The tensile strained silicon layer 130 provides for enhanced transport of electrons, thereby enhancing the current drive of the NMOS device.

A strained silicon layer may be achieved by controlling the silicon (Si) and germanium (Ge) concentrations in a SiGe layer. The lattice constant of the SiGe layer may be controlled by adjusting the germanium concentration. The thickness of the SRB layer 120 is higher than that of the silicon substrate layer 110. The strained relaxed buffer 120 of FIG. 1 may be about 1 micron (um) to about 5 um. The lattice constant of the strained relaxed buffer 120 is greater than the lattice constant of the silicon substrate layer 110.

A strained channel material layer 130 is formed on the strained relaxed buffer 120. The thickness of the channel material layer 130 may be about 6 nm to 50 nm. The channel material layer 130 may be a silicon channel layer or a combination of silicon and germanium layer. The top channel layer 130 is formed to have a biaxial tensile strain. The electron mobility in the channel material layer 130 is higher than that of the silicon substrate 110.

Similarly, a base structure to form PMOS devices may also be fabricated. FIG. 2 illustrates a stylized cross-sectional view of a prior art base structure for forming a PMOS device. A silicon substrate layer 210 is formed, upon which a strained relaxed buffer (SRB) layer 220 may be formed. The buffer layer 220 is required to be strain relaxed in order to allow the formation of a strained silicon layer 230. A strained channel material 230 is then formed on the SRB layer 220. For forming a PMOS device, the strain is directed to a compressive strain. The compressive strained silicon layer 230 provides for enhanced transport of holes.

As noted above, the lattice constant of the SiGe layer may be controlled by adjusting the germanium concentration. The lattice constant of the SRB layer 220 is higher than that of the silicon substrate layer 210. The strained relaxed buffer 220 of FIG. 2 may be 1 um to 5 um. The lattice constant of the strained relaxed buffer 220 is greater than the lattice constant of the silicon substrate layer 210.

A strained channel material layer 230 is formed on the strained relaxed buffer 220. The thickness of the channel material may be about 6 nm to 50 nm. The channel material layer 230 may be a germanium channel layer of a combination of silicon and germanium layer. The top channel layer 230 is formed to have a biaxial compressive strain. The hole mobility in the channel material layer 230 is higher than that of the silicon substrate 210.

The base structures described above are generally formed separately in different processes. The base structures are then integrated for forming NMOS and PMOS devices. This separate manufacturing of the base structures may be time-consuming, inefficient and costly.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a semiconductor substrate on which NMOS and PMOS devices with enhanced current drives may be formed. A first substrate having an enhanced electron mobility is formed. A second substrate having an enhanced hole mobility is formed. The first substrate and the second substrate are bonded for forming a third substrate. A first channel on the third substrate characterized by the enhanced electron mobility is formed. A second channel on the third substrate characterized by the enhanced hole mobility is formed.

BRIEF DESCRIPTION OF THE DRAWINGS

The disclosure may be understood by reference to the following description taken in conjunction with the accompanying drawings, in which like reference numerals identify like elements, and in which:

FIG. 6-14 illustrates a stylized cross-sectional view of a first and second substrates being processed for forming a third substrate, in accordance with some embodiments herein;

Figure 1:
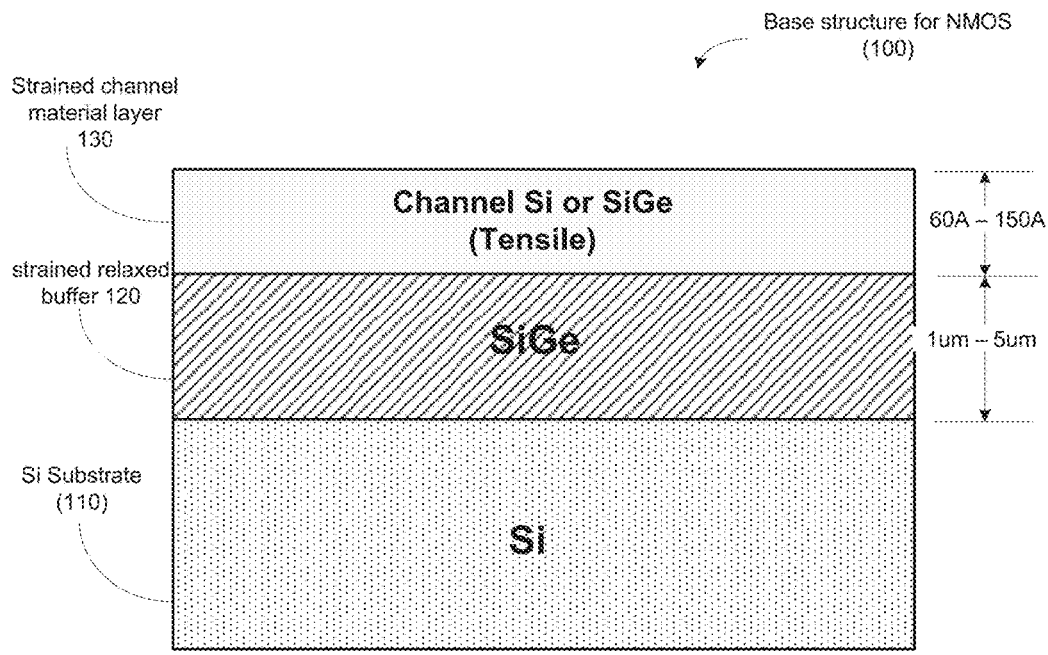
FIG. 1 illustrates a stylized cross-sectional view of a prior art base structure for forming an NMOS device.
Figure 2:
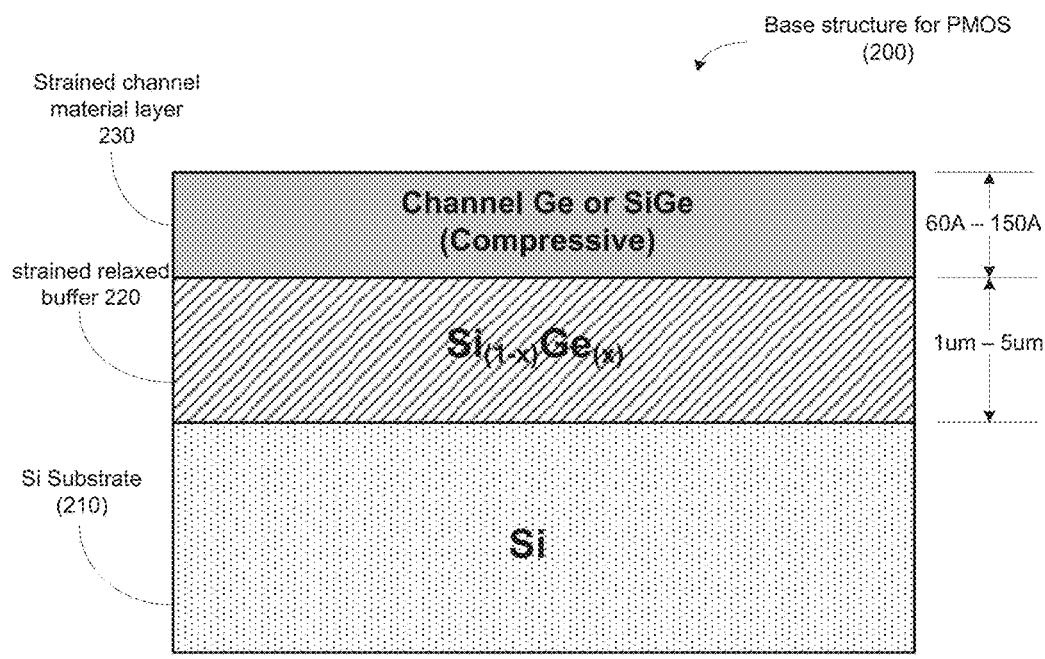
FIG. 2 illustrates a stylized cross-sectional view of a prior art base structure for forming a PMOS device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will, of course, be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for fabricating semiconductor substrate wafers for forming NMOS and/or PMOS devices, e.g., transistors. Embodiments herein provide for integrating different channel materials onto the same substrate wafer, thereby providing the ability to form PMOS and/or NMOS devices with enhanced current drive on a single substrate wafer. The integration of the different channel material onto a substrate wafer provided by embodiments herein may provide improved device performed and/or reduced power consumption during the operation of the devices. Embodiments herein provide for forming respectively different channels with higher mobility for PMOS and NMOS on a single substrate wafer.

Figure 3:
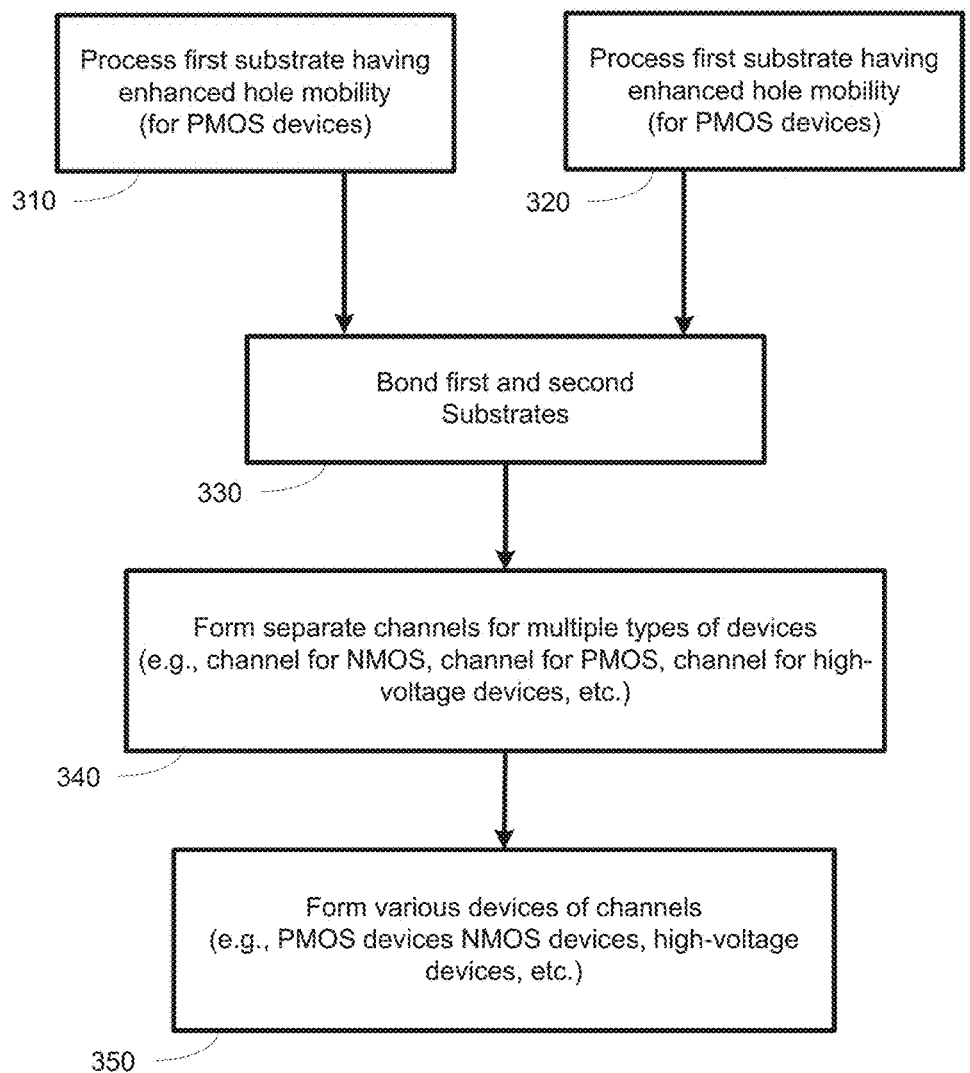
FIG. 3 illustrates a flowchart depiction of a method for providing a substrate wafer for forming PMOS and NMOS devices, in accordance with some embodiments herein.

Turning now to FIG. 3, a flowchart depiction of a method for providing a substrate wafer for forming PMOS and NMOS devices, in accordance with embodiments herein. A first substrate, on which PMOS device may be formed, is processed (block 310). The first substrate is designed to have the characteristic of higher hole mobility as compared to standard substrates. A more detailed description of the process of block 310 is provided in FIG. 4 and accompanying description below.

Figure 4:
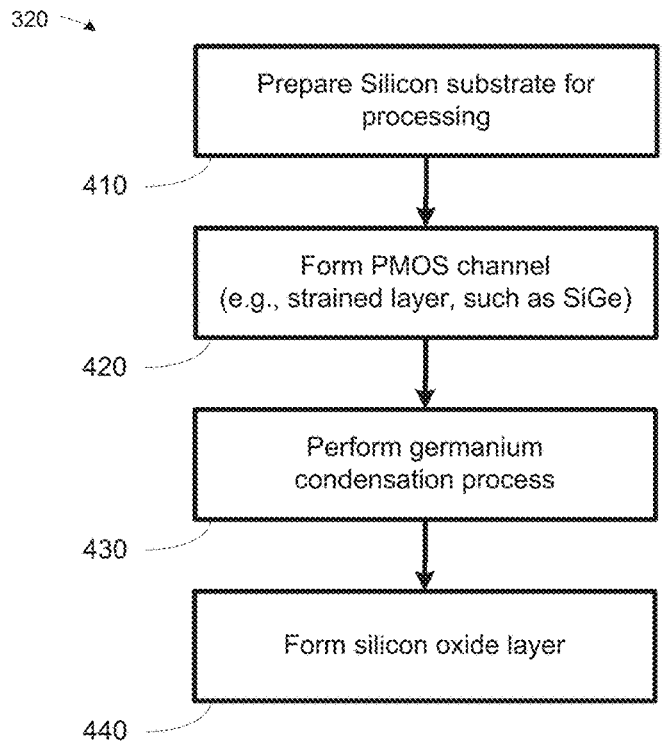
FIG. 4 illustrates a flowchart depiction of a method for processing a first substrate for PMOS devices of FIG. 3, in accordance with some embodiments herein.

Referring simultaneously to FIGS. 3 and 4, in one embodiment, in order to form the first substrate, a silicon (Si) substrate is prepared for processing (block 410). A PFET channel is formed in the silicon substrate (block 420). In one embodiment, the PFET channel may be formed by applying a strained layer, such as an epitaxial strained SiGe layer. A germanium condensation process may be performed (block 430). Subsequently, a silicon oxide ($SiO_2$) layer may then be formed (block 340). In this manner a substrate that comprises an increased hole mobility is prepared.

Referring to FIG. 3, a second substrate, on which NMOS device may be formed, is processed (block 320). The second substrate is designed to have the characteristic of higher electron mobility as compared to standard substrates. A more detailed description of the process of block 320 is provided in FIG. 5 and accompanying description below.

Figure 5:
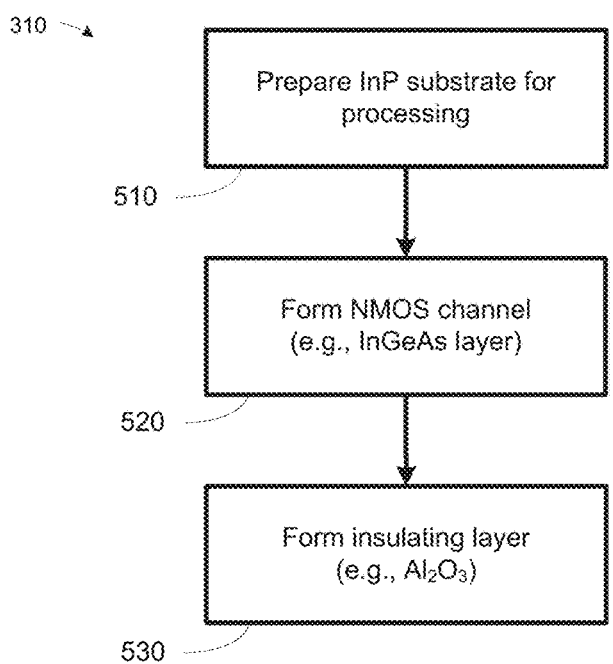
FIG. 5 illustrates a flowchart depiction of a method for processing a first substrate for PMOS devices of FIG. 3, in accordance with some embodiments herein.

Referring simultaneously to FIGS. 3 and 5, in one embodiment, in order to form the second substrate, an indium-phosphate (InP) substrate is prepared for processing (block 510). Subsequently, an NFET channel material is formed on the second substrate (block 520). For example, an Indium-gallium-arsenide (InGaAs) layer may be formed. An insulating layer may then be formed (block 530). For example, an $Al_2O_3$ layer may be formed as an insulating layer. In this manner a substrate that comprises increased electron mobility is prepared.

Referring to FIG. 3, once the first and second substrates are formed, a bonding process for bonding the first and second substrates may be performed (block 330). Once bonded, the bonded substrate may be processed to form separate channels for forming multiple types of devices, e.g., a channel for forming NMOS devices, a channel for forming PMOS device, and/or a channel for forming high-voltage devices (block 340). Upon processing the bonded substrate, various devices (e.g., nFET, pFET, etc.) may be formed on the bonded and processed substrate (block 350). In some embodiment, the various devices may be formed as part of a single processing protocol.

FIGS. 6-14 illustrate stylized depictions of process steps for providing a substrate wafer for forming PMOS and NMOS devices, in accordance with embodiments herein. As shown in FIG. 6, a first wafer 600 for accommodating NMOS devices with enhanced/higher drive current is formed. In one embodiment, an indium-phosphate layer 610 (handle wafer) is formed. Upon the indium-phosphate layer 610, an indium-gallium-arsenide (InGaAs) layer 620 is formed. Subsequently, an aluminum oxide ($Al_2O_3$) layer 630 is formed over the layer 620. In one embodiment, the first wafer 600 comprises a tensile channel.

The first wafer 600 comprises the characteristic of increased electron mobility. Accordingly, the first wafer 600 provides for the ability to form NMOS devices (e.g., NFET devices) that comprise enhanced and efficient current drive properties. In some embodiments, higher current drive of NMOS devices formed on the first wafer 600 allow for operations using lower operating voltages.

As shown in FIG. 7, a second wafer 700 for accommodating PMOS devices with higher current drive is formed. A silicon substrate layer 710 is formed. Upon the layer 710 a silicon germanium layer 720 is formed. In one embodiment, the concentration of germanium in the SiGe layer 720 is greater than 85%, which provides for a strained channel material layer. This provides for higher hole mobility, which results in higher drive current capabilities for a PMOS device.

Further, a silicon oxide layer 730 is formed over the SiGe layer 730. In one embodiment, the second wafer 700 comprises a compressive channel. The degree of compression is directly proportional to the concentration of germanium. That is, the higher the germanium concentration, the greater the compressive characteristic of the channel.

The second wafer 700 comprises the characteristic of increased hole mobility. Accordingly, the second wafer 700 provides for the ability to form PMOS devices (e.g., pFET devices) that comprise enhanced and efficient current flow properties. In some embodiments, PMOS devices formed on the second wafer 700 comprises higher current drive capabilities, allowing for operations using lower operating voltages.

Figure 8:
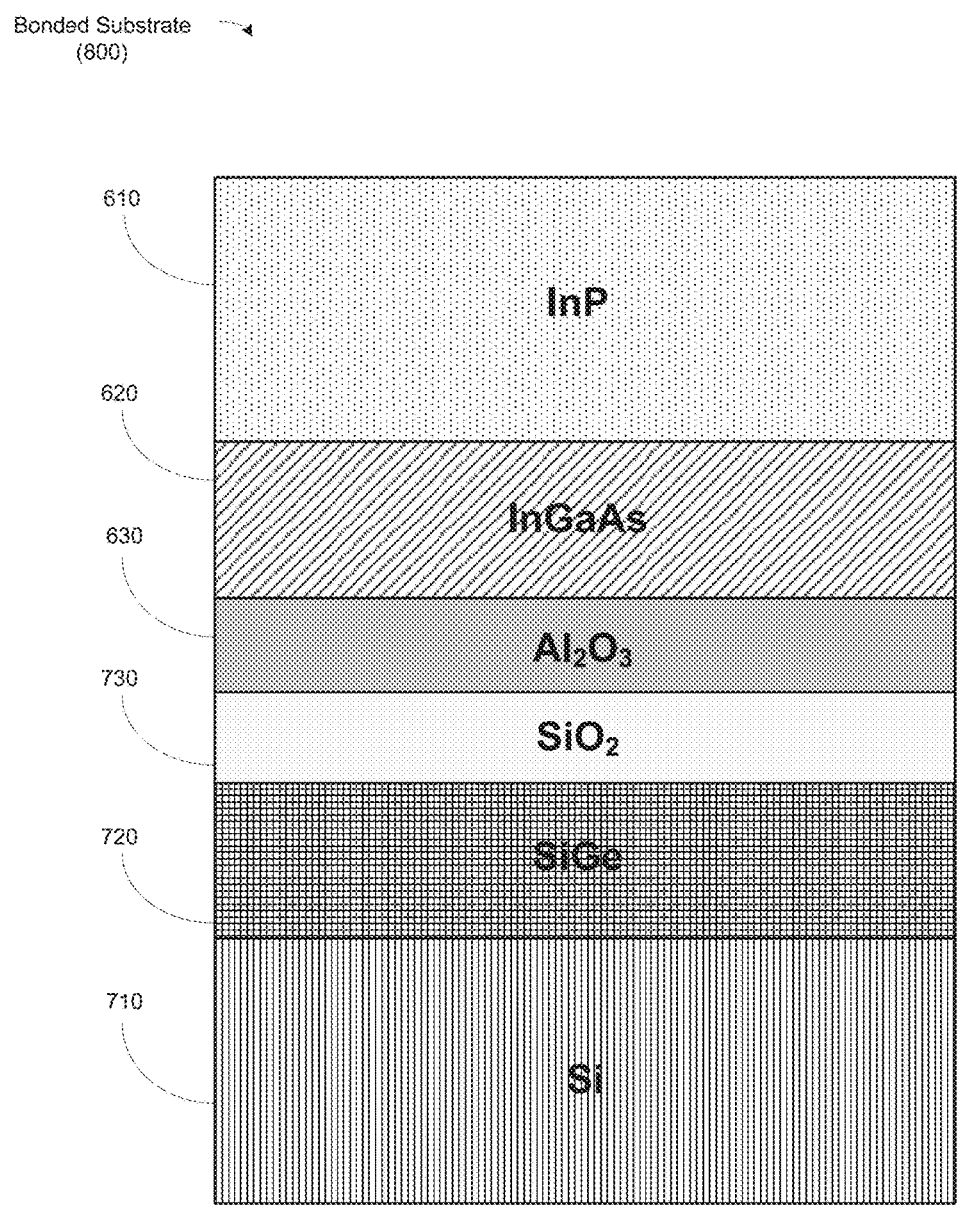

Embodiments herein provide for integrating the first wafer 600 and the second wafer 700 for providing a single substrate that provide for forming PMOS and NMOS devices that are of higher drive currents. FIG. 8 illustrates an arrangement of the first and second wafers for integrating the PMOS and NMOS channels into a signal substrate, in accordance with one embodiment. The first and second wafers 600, 700 are bonded together in the manner shown in FIG. 8. That is, the first wafer 600 is positioned in an inverted fashion upon the second wafer 700. Once the first and second wafer 600, 700 are bonded together, a single bonded substrate 800 is formed.

Upon performing the bonding of the first and second wafers 600, 700, the single substrate 800 comprises various layers. The silicon germanium (SiGe) layer 720 is over the silicon layer 710. The silicon oxide layer 730 is over the SiGe layer 720. The $Al_2O_3$ layer 630 is over the silicon oxide layer 630. The InGaAs layer 620 is over the $Al_2O_3$ layer 630, followed by the InP layer 610.

The substrate 800 comprises characteristics such that further processing may result in a wafer on which PMOS and NMOS, both of higher drive capabilities, may be formed. Moreover, the InGaAs and SiGe materials comprise the characteristic of only requiring low thermal processing. Accordingly, both materials (InGaAs and SiGe) can be integrated into the substrate 800 in a similar manner, with similar thermal cycles.

Since the substrate 800 can be processed to accommodate both higher drive PMOS and NMOS devices, an isolation feature, such as a shallow trench isolation (STI) is formed. By separating those regions by using such isolation features, both NMOS and PMOS devices can be formed on the same substrate 800.

Further, access to the silicon layer 710 is also made possible by processing the substrate 800. That is, portions of the substrate 800 may be processed such that the silicon layer of the substrate 800 may be used as a channel for forming devices. The silicon channels, for example, may be used to form legacy devices, high-voltage devices, input/output (I/O) devices, etc. Accordingly, the substrate 800 may be processed to have three types of channels, a higher-drive NMOS channel, a higher-drive PMOS channel, and a silicon channel.

Figure 9:
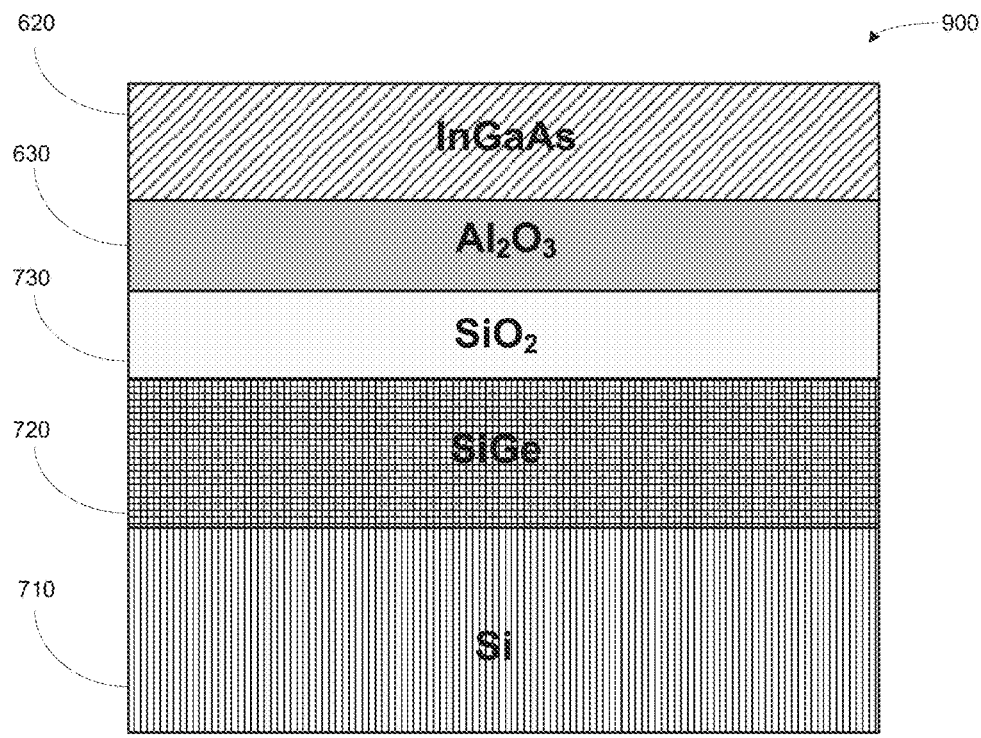

The InP layer 610 (handle wafer) may be removed, as shown in FIG. 9. Upon the substrate 900 of FIG. 9, NMOS devices of higher drive may be formed. If the top regions of the substrate were removed down to the silicon germanium layer 720, PMOS devices of higher drive may be formed. Accordingly, the single substrate 900 of FIG. 9 is capable of accommodating PMOS and NMOS devices.

Moreover, the InGaAs layer 620 may be substituted with a gallium arsenide layer of an InP layer, upon which PMOS devices may be formed. These substitutions may depend on the type of devices to be formed. For example, if a light emitting diode (LED) that emits blue light were to be formed, the layer 620 may be comprised of gallium arsenide.

Figure 10:
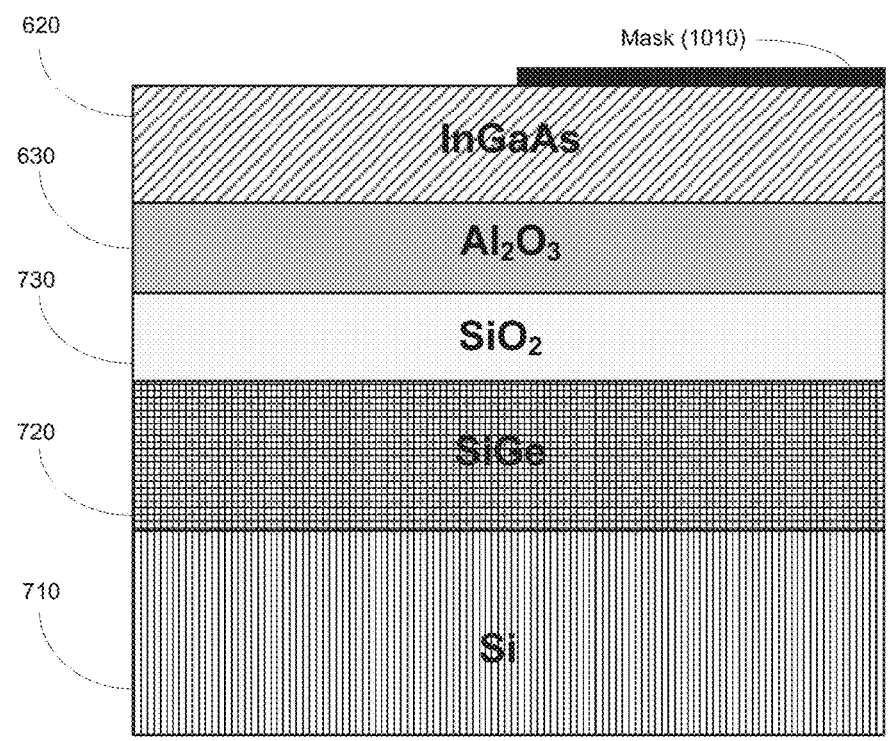

As shown in FIG. 10, a mask 1010 may be added to a portion of the substrate 900, upon which NMOS devices are to be formed. The portion of the substrate 900 upon which PMOS devices are to be formed are left without a mask during a removal process, such as an etch process.

Figure 11:
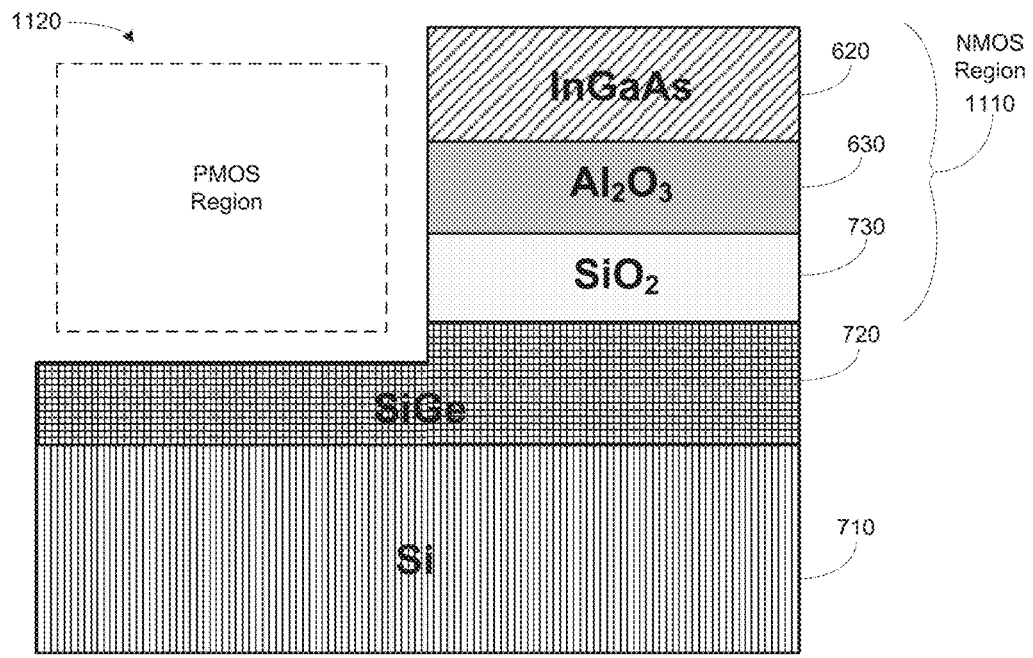

Upon performing a removal process (e.g., etch process), the substrate shown in FIG. 11 is provided. The mask prevents the removal of the NMOS region 1110 from being removed, but etches away the silicon oxide layer 730, the $Al_2O_3$ layer 630, and the InGaAs layer 620, revealing the SiGe layer 720. The region 1120 above the SiGe layer 720 is the region upon which PMOS devices would be formed.

Figure 12:
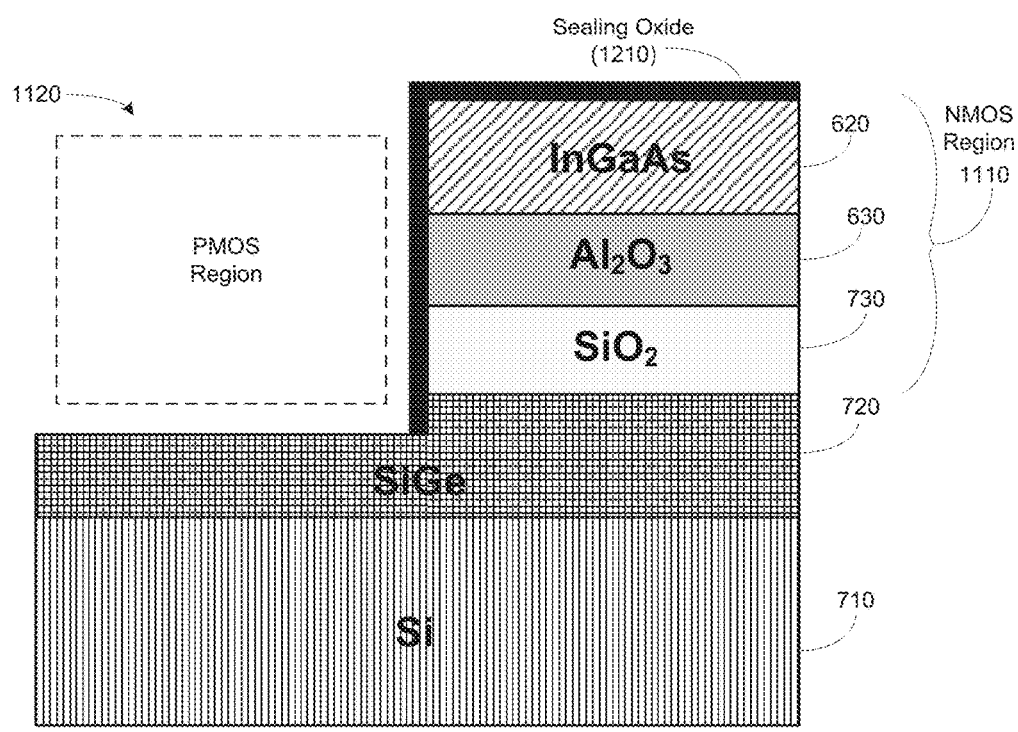
Figure 13:
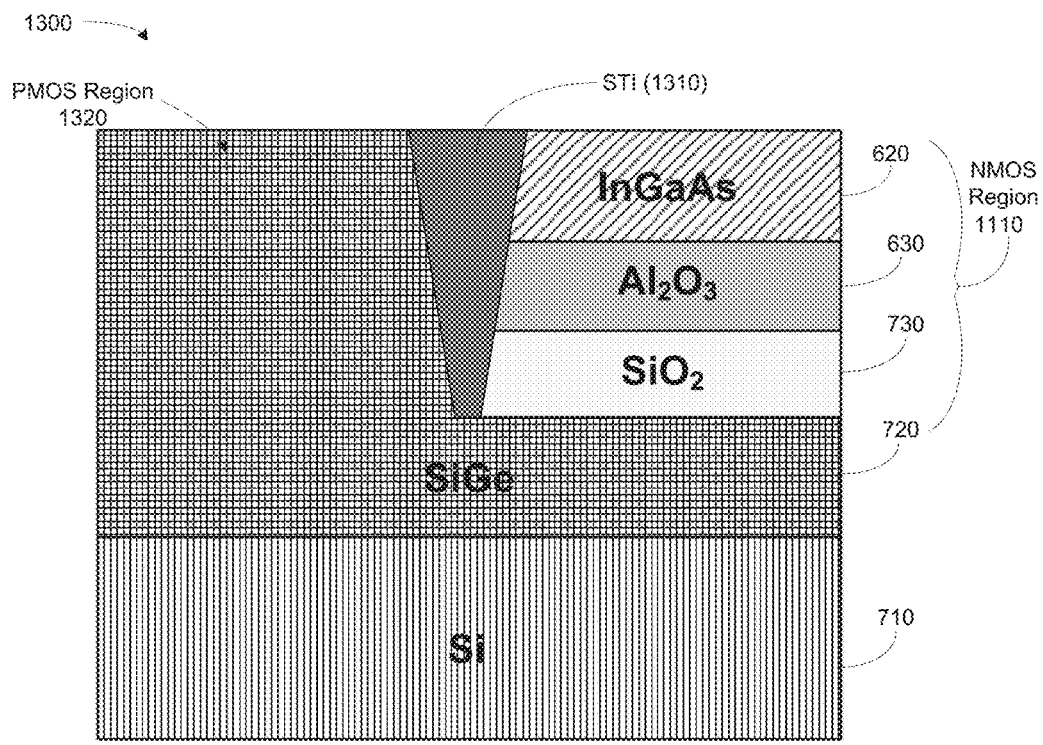

In one embodiment, as shown in FIG. 12, a sealing material 1210 may be placed about the NMOS region. In one embodiment, the sealing material 1210 may be an oxide material or a stack of oxide, nitride materials. Upon sealing off the NMOS region, a buffer feature 1310, such as an STI may be formed adjacent to the NMOS region 1110, as shown in FIG. 13. In one embodiment, the STI 1310 may be comprised of silicon oxide ($SiO_2$). In another embodiment, the STI 1310 may be comprised of $AlO_2$.

The STI 1310 provides an means for isolation between the InGaAs layer 620 and the SiGe layer 720. As a result of forming the STI 1310, unintentional doping of the InGaAs layer 620 caused by the silicon in the SiGe layer 720 is substantially avoided. Similarly, as a result of forming the STI 1310, unintentional doping of the SiGe layer 720 caused by the arsenic in the InGaAs layer 620 is substantially avoided.

As shown in FIG. 13, the sealing material 1210 of FIG. 12 may be removed. Further, an additional amount of SiGe may be formed to provide the additional SiGe layer 1320, as shown in FIG. 13. Accordingly, the substrate 1300 of FIG. 13 is a single substrate that comprises a NMOS region 1110 upon which NMOS devices may be formed, and a PMOS region 1320, upon which PMOS devices may be formed. The SiGe region 1320 may be comprised of 25% germanium, up to 100% germanium.

Figure 14:
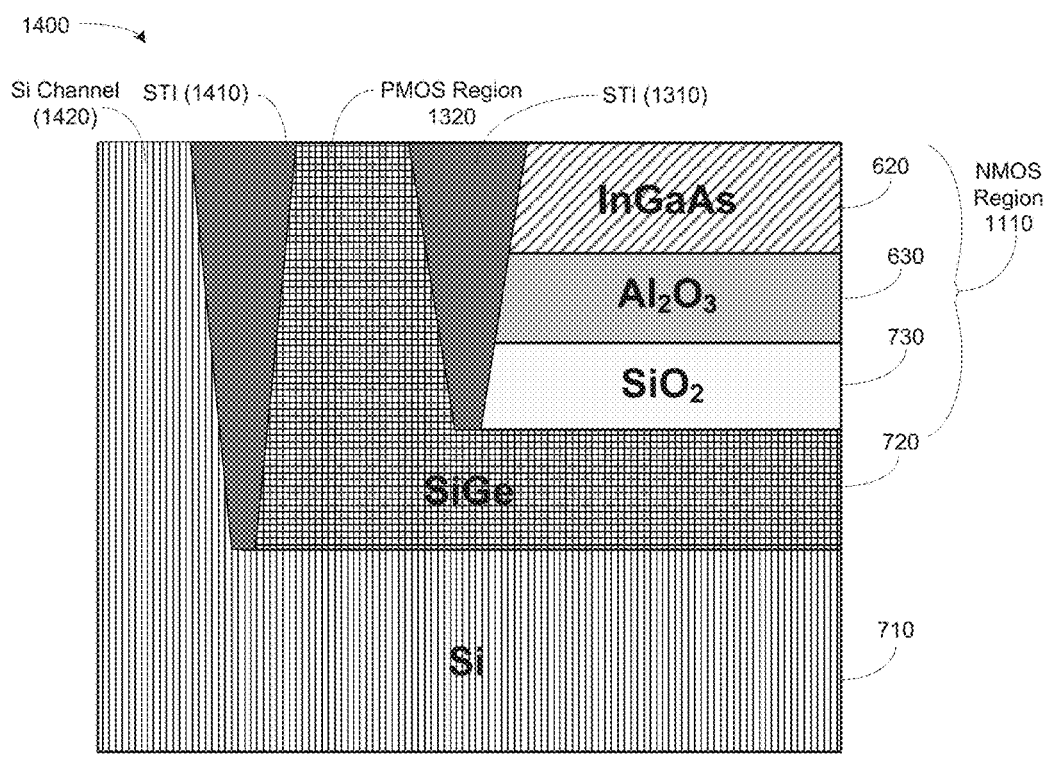

In another embodiment, as shown in FIG. 14, a portion of the SiGe region 1320 may be etched off to expose the Si layer. A second STI 1410 may be formed to isolate the SiGe 1320 region. Beyond the STI 1410, silicon may be formed to provide the silicon region 1420. Therefore, the STI 1410 provides isolation between the SiGe region 1320 and the Si region 1420. In this manner three channel regions may be provided on a single substrate 1400 using the same processing steps: the NMOS region 1110, the PMOS region 1320, and a Si channel region 1420. Accordingly, using a single processing protocol, the substrate 1400 provides for forming PMOS devices, NMOS devices, as well as devices formed on a Si channel (e.g., legacy devices, high voltage devices, I/O devices, etc.).

Figure 15:
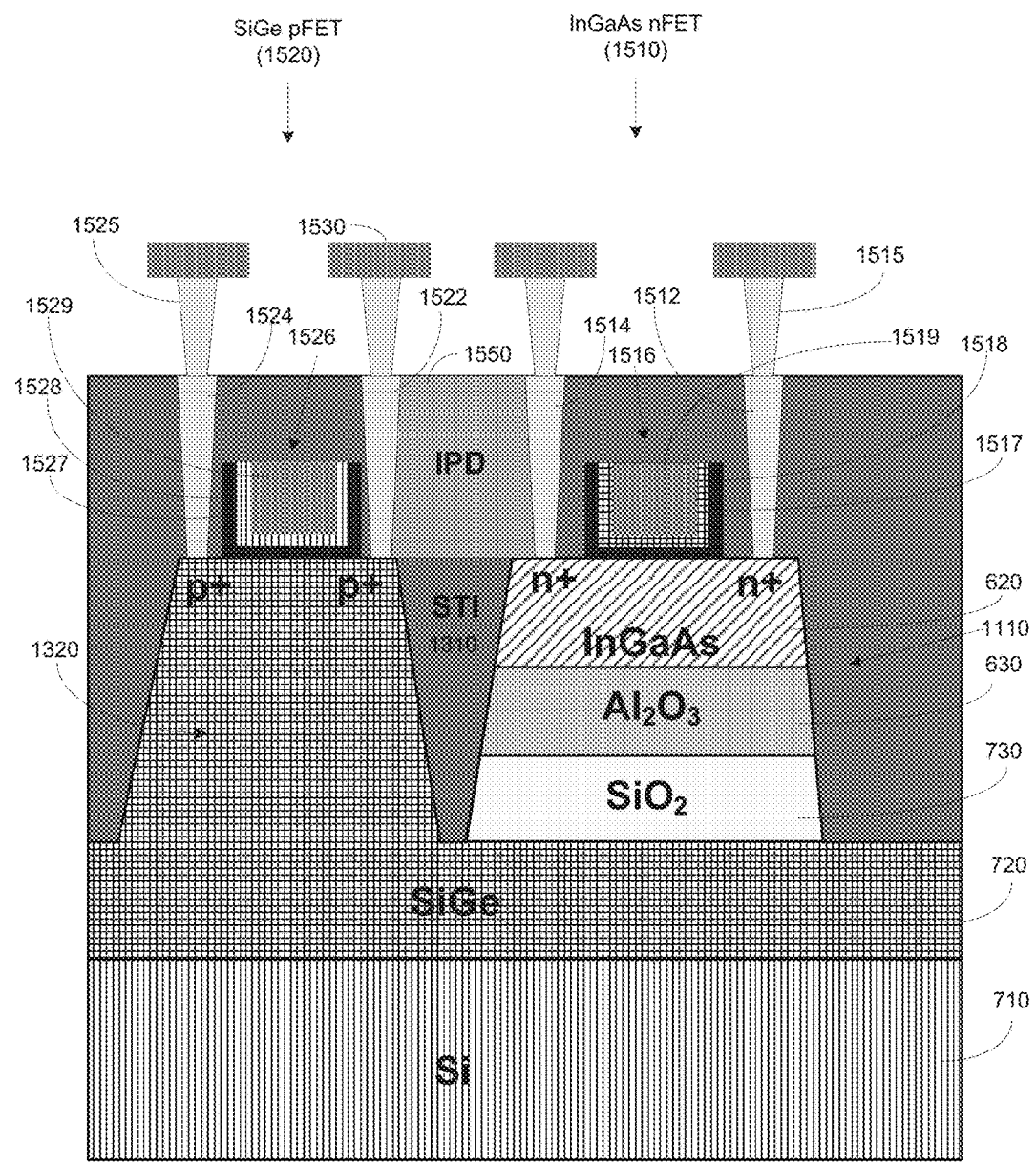
FIG. 15 illustrates a stylized cross-sectional view of forming an NMOS device and a PMOS device on a substrate, in accordance with some embodiments herein.

Turning now to FIG. 15, an exemplary base structure (substrate) that comprises PMOS and NMOS devices, accordance with one embodiment, is illustrated. The substrate 1500 comprises an NMOS region 1110 on which NMOS devices may be formed. The substrate 1500 also comprises a PMOS region 1120 on which PMOS devices may be formed. The NMOS and PMOS regions 1110, 1120 are isolated from each other by the STI 1310.

The NMOS region 1110 comprises an InGaAs layer 620, on which an nFET device 1510 may be formed. The InGaAs layer 620 comprises n+ regions formed by introducing a doping material, such as silicon. Self-aligned contacts (SAC) 1512, 1514 for the drain and source portions of the nFET device 1510 may be formed on the InGaAs layer 620. Upon the SAC 1512 and 1514, a middle-of-line contact (MOL) 1515 may be formed. A plurality of back-end-of-line (BEOL) contacts 1530 may be formed on the source and drain regions, on respective MOLs 1515.

Further, a gate 1516 for the nFET device 1510 is formed on the InGaAs layer 620. The gate 1516 may be formed by forming an Hi-k dielectric layer 1517 (e.g., HfO$_2$), an n-type work function metal layer 1518 (e.g., TiAlC, TiC, etc.), and a low resistance gate metal layer 1519 (e.g., W, Al, etc.).

The PMOS region 1120 comprises the SiGe layer 1320, on which a pFET device 1520 may be formed. The SiGe layer 1320 comprises p+ regions formed by introducing a doping material such as Boron. Self-aligned contacts (SAC) 1522 for the drain and source portions of the pFET device 1520 may be formed on the SiGe layer 720. Upon the SAC 1524, an MOL 1525 may be formed, and upon the SAC 1512, an MOL 1515 may be formed. In one embodiment, the MOLs 1515, 1525 may be formed during a single processing step. In one embodiment, the SACs 1512, 1214, 1522, 1524 may be formed during a single processing step. In another embodiment, the SACs 1512, 1214, 1522, 1524 may be formed during a separate processing steps. For example, a first processing step may be used to form the PMOS SACs 1522, 1524, and a second processing step may be used to form the NMOS SACs 1512, 1514.

A plurality of BEOL contacts 1530 may be formed on the source and drain regions, on respective MOLs 1515. A source contact 1524 and a drain contact 1522 may be formed on the SiGe layer 1320. A plurality of BEOL contacts 1530 may be formed on the source and drain regions on respective MOLs 1525. Further, a gate 1526 for the pFET device 1520 is formed on the SiGe layer 1320. The gate 1526 may be formed by forming an Hi-k dielectric layer 1527 (e.g., HfO$_2$), a p-type work function metal layer 1528 (e.g., TiN), and a low resistance gate metal layer 1529 (e.g., W, Al, etc.).

In one embodiment, the Hi-k dielectric layer 1527 (e.g., HfO$_2$) is the same on NFET and PFET devices, and are generally formed at the same time using the same processing step. Further, in one embodiment, the low resistance gate metal layers 1519 and 1529 may generally be formed at the same time using the same processing step.

In this manner an NMOS device (e.g., nFET 1510) and a PMOS device (e.g., pFET 1520) may be formed on a single substrate 1500. The NMOS device and PMOS device may be separated by a inter poly dielectric (IPD) feature 1550, which in one embodiment, may be comprised of an oxide material. In one embodiment, the pFET device 1520 and the nFET device 1510 may be formed during the same time. In another embodiment, if a higher thermal cycle is required for forming the nFET device 1510, this process is performed prior to performing the process for forming the pFET device 1520.

Figure 16:
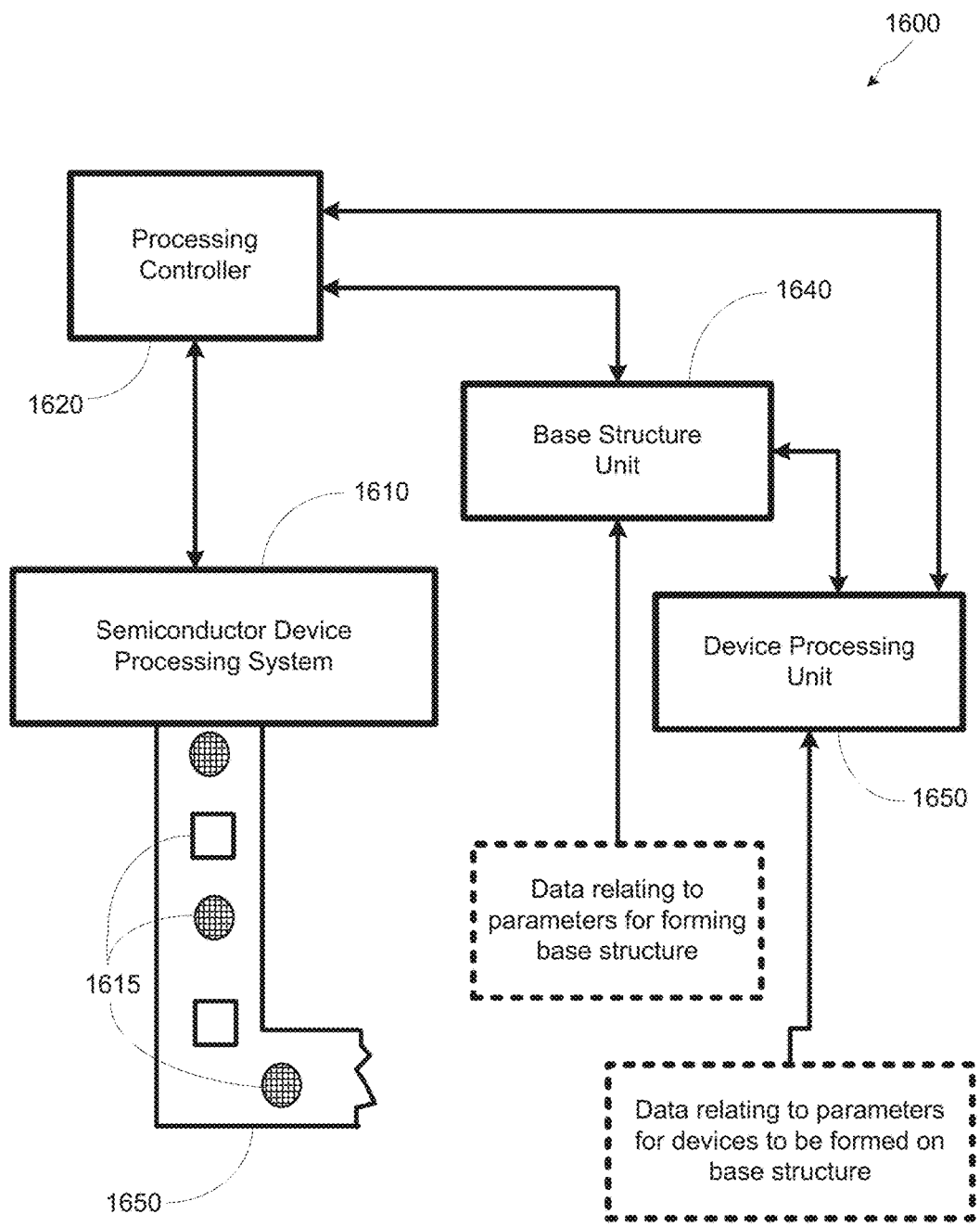
FIG. 16 illustrates a stylized depiction of a system for fabricating a semiconductor substrate on which PMOS and NMOS devices comprising enhanced current drive may be formed, in accordance with some embodiments herein.

Turning now to FIG. 16, a stylized depiction of a system for fabricating a semiconductor substrate on which PMOS and NMOS devices comprising enhanced current drive may be formed, is illustrated. The system 1600 of FIG. 16 may comprise a semiconductor device processing system 1610 and an integrated circuit design unit 1640. The semiconductor device processing system 1610 may manufacture integrated circuit devices based upon one or more designs from the base structure unit 1640 and/or the device process unit 1660.

The semiconductor device processing system 1610 may comprise various processing stations, such as etch process stations, photolithography process stations, CMP process stations, etc. One or more of the processing steps performed by the processing system 1610 may be controlled by the processing controller 1620. The processing controller 1620 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1610 may produce integrated circuits on a medium, such as silicon wafers. The system 1600 is capable of performing various process steps for forming the base structure illustrated above in conjunction with the process steps exemplified in FIGS. 6-16. The production of integrated circuits by the device processing system 1610 may be based upon the circuit designs provided by the integrated circuits design unit 1640. The processing system 1610 may provide processed integrated circuits/devices 1615 on a transport mechanism 1650, such as a conveyor system. In some embodiments, the conveyor system may be sophisticated clean room transport systems that are capable of transporting semiconductor wafers. In one embodiment, the semiconductor device processing system 1610 may comprise a plurality of processing steps, e.g., the $1^{st}$ process step, the $2^{nd}$ process set, etc., as described above.

In some embodiments, the items labeled "1615" may represent individual wafers, and in other embodiments, the items 1615 may represent a group of semiconductor wafers, e.g., a "lot" of semiconductor wafers. The integrated circuit or device 1615 may be a transistor, a capacitor, a resistor, a memory cell, a processor, and/or the like. In one embodiment, the device 1615 is a transistor and the dielectric layer is a gate insulation layer for the transistor.

The base structure unit 1640 may provide for designing base structure comprising a NMOS, PMOS and silicon channel regions described herein. In one embodiment, based upon predetermined parameters defining the base structure (e.g., dimensions of the substrate layer, dimensions of parameters relating to the strained relaxed buffer, dimensions of parameter relating to the strain and compressive layers described herein, etc.), manufacturing data comprising the parameters may be automatically created and provided to the processing controller 1620 for fabricating the base structure. The parameters relating to the base structure may be provided automatically by a computing device, or alternatively, manually by a user via a graphical user interface (GUI).

Further, base structure information, along with data relating to parameters for processing a device on the base structure may be provided to the device processing unit 1660. The device processing unit 1660 may automatically generate data for fabricating integrated circuit devices on the base structure. This data may be provided to the processing controller 1620 for manufacturing integrated circuit devices using the base structure.

The system 1600 may be capable of performing analysis and manufacturing of various products involving various technologies. For example, the system 1600 may receive design and production data for manufacturing devices of CMOS technology, Flash technology, BiCMOS technology, power devices, memory devices (e.g., DRAM devices), NAND memory devices, and/or various other semiconductor technologies.

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for providing a semiconductor base structure, comprising:
   forming a first substrate having an enhanced electron mobility;
   forming a second substrate having an enhanced hole mobility;
   bonding said first substrate and said second substrate for forming a third substrate;
   forming a first channel on said third substrate characterized by said enhanced electron mobility;
   forming a second channel on said third substrate characterized by said enhanced hole mobility; and
   forming a shallow trench isolation (STI) in said third substrate between said first channel and said second channel;
   wherein forming said first substrate comprises:
      forming an indium-phosphate (InP) layer;
      forming an indium-gallium-arsenide (InGaAs) layer above said InP layer; and
      forming an aluminum oxide ($Al_2O_3$) layer above said InGaAs layer; and
   forming said second substrate comprises:
      forming a silicon (Si) layer;
      forming a silicon germanium (SiGe) layer above said Si layer; and
      forming a silicon oxide ($SiO_2$) layer over said SiGe layer.

2. The method of claim 1, further comprising:
   forming an NMOS device on said first channel; and
   forming a PMOS device on said second channel.

3. The method of claim 2, wherein:
   forming said NMOS device comprises forming an N-channel MOSFET; and
   firming said PMOS device comprises forming a P-channel MOSFET.

4. The method of claim 1, wherein bonding said first substrate and said second substrate for forming said third substrate comprises:
   positioning said first substrate in an inverted configuration over said second substrate; and removing said InP layer, wherein said third substrate comprises said silicon layer, said SiGe layer over said silicon layer, said silicon oxide layer over said SiGe layer, said $Al_2O_3$ layer over silicon oxide, and said InGaAs layer over said $Al_2O_3$ layer.

5. The method of claim 4, further comprising:
   depositing a mask over a first region of said third substrate for forming an NMOS device;
   performing an etch process on said third substrate for forming a second region for forming a PMOS device;
   depositing additional SiGe material over said SiGe layer;
   isolating electrically said first region and said second region;
   forming a first self-aligned contact (SAC) above said first region and a first middle-of-line contact (MOL) above said first SAC; and
   forming a second self-aligned contact (SAC) above said second region and a second middle-of-line contact (MOL) above said second SAC.

6. The method of claim 5, wherein isolating electrically said first region and said second region comprises forming an shallow isolation trench between said first and second regions.

7. The method of claim 6, further comprising:
   depositing a mask over a first region of said third substrate for forming silicon channel NMOS and PMOS device; and
   performing an etch process on said third substrate for forming a third region, wherein said SiGe layer is etched to expose said silicon layer.

8. A semiconductor substrate, comprising: a first substrate portion having an enhanced electron mobility; a second substrate portion having an enhanced hole mobility; and
   a shallow trench isolation (STI) between said first substrate portion and said second substrate portion;
   wherein said first substrate portion and said second substrate portion are bonded to form a first channel characterized by said enhanced electron mobility and a second channel characterized by said enhanced hole mobility;

wherein forming said first substrate portion comprises:
forming an indium-phosphate (InP) layer;
forming an indium-gallium-arsenide (InGaAs) layer above said InP layer; and forming an aluminum oxide (Al$_2$O$_3$) layer above said InGaAs layer; and forming said second substrate portion comprises: forming a silicon (Si) layer;
forming a silicon germanium (SiGe) layer above said Si layer; and forming a silicon oxide (SiO$_2$) layer over said SiGe layer.

9. The semiconductor substrate of claim 8, wherein said first channel is capable of providing an enhanced current drive for an NMOS device formed on the first channel, and said second channel is capable of providing an enhanced current drive for a PMOS device formed on the second channel.

10. The semiconductor substrate of claim 9, wherein said NMOS device is at least one of an N-channel MOSFET or an N-channel finFET; and wherein said PMOS device is at least one of a P-channel MOSFET or a P-channel finFET.

11. The semiconductor substrate of claim 8, wherein said first channel comprises a tensile characteristic and second channel comprises a compressive characteristic.

12. The semiconductor substrate of claim 8, further comprising a third channel, wherein said third channel comprises a silicon layer.

13. The semiconductor substrate of claim 8, wherein said first channel comprises said silicon layer, said SiGe layer over said silicon layer, said silicon oxide layer over said SiGe layer, said Al$_2$O$_3$ over said InGaAs, and said InGaAs layer over said Al$_2$O$_3$ layer; and said second channel comprises said silicon layer and said SiGe layer over said silicon layer; wherein said first and second channels are electrically isolated.

* * * * *